(12) United States Patent
Nguyen

(10) Patent No.: US 7,089,160 B2
(45) Date of Patent: Aug. 8, 2006

(54) MODEL FOR MODIFYING DRILL DATA TO PREDICT HOLE LOCATIONS IN A PANEL STRUCTURE

(75) Inventor: Manh-Quan Tam Nguyen, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 835 days.

(21) Appl. No.: 10/042,539

(22) Filed: Jan. 8, 2002

(65) Prior Publication Data

US 2003/0130826 A1      Jul. 10, 2003

(51) Int. Cl.
*G06F 17/10*     (2006.01)
(52) U.S. Cl. .......................... 703/2; 700/193
(58) Field of Classification Search ............ 703/2; 700/192–194
See application file for complete search history.

(56) References Cited

U.S. PATENT DOCUMENTS

| | | | |
|---|---|---|---|
| 4,123,695 A | 10/1978 | Hale et al. | |
| 4,709,694 A | 12/1987 | Wilnet et al. | |
| 4,829,375 A | 5/1989 | Alzmann et al. | |
| 5,111,406 A | 5/1992 | Zachman et al. | |
| 5,206,820 A | 4/1993 | Ammann et al. | |
| 5,233,536 A | 8/1993 | Araki et al. | |
| 5,529,441 A | 6/1996 | Kosmowski et al. | |
| 5,691,909 A * | 11/1997 | Frey et al. ................. | 700/159 |
| 5,710,063 A | 1/1998 | Forehand et al. | |
| 6,030,154 A | 2/2000 | Whitcomb et al. | |
| 6,683,316 B1* | 1/2004 | Schamber et al. ........ | 250/492.1 |
| 6,819,974 B1* | 11/2004 | Coleman et al. ........... | 700/195 |
| 6,901,809 B1* | 6/2005 | Dong et al. ................. | 73/789 |

FOREIGN PATENT DOCUMENTS

| | | |
|---|---|---|
| EP | 0 669 792 A2 | 8/1995 |
| JP | 3-136708 | 6/1991 |

* cited by examiner

*Primary Examiner*—Albert W. Paladini
(74) *Attorney, Agent, or Firm*—Scully, Scott, Murphy & Presser; William H. Steinberg, Esq.

(57) ABSTRACT

A method of creating a mathematical model which is employed in the determination of at least one work location in a multi-layered laminated circuit panel. The mathematical model for modifying drill data takes into consideration translational and rotational compensations caused by the encountered stretching or shrinking of the multi-layered panel subsequent to pressing or due to thermally processing, whereby the mathematical model may be utilized to modify drill data in order to accurately predict hole or via locations.

15 Claims, 1 Drawing Sheet

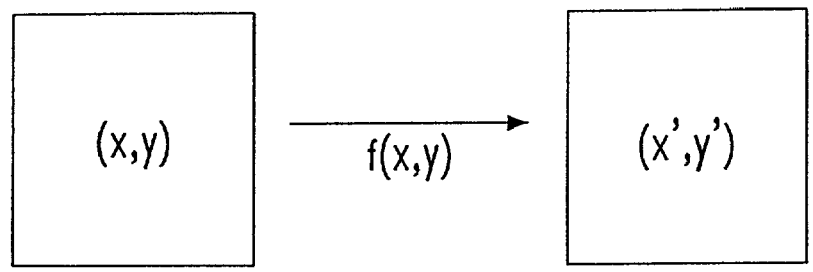
*FIG. 1*
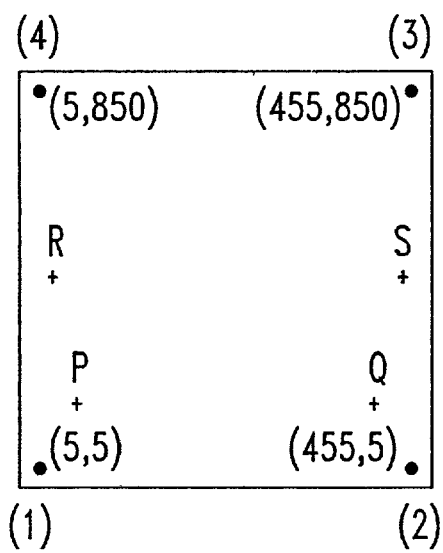
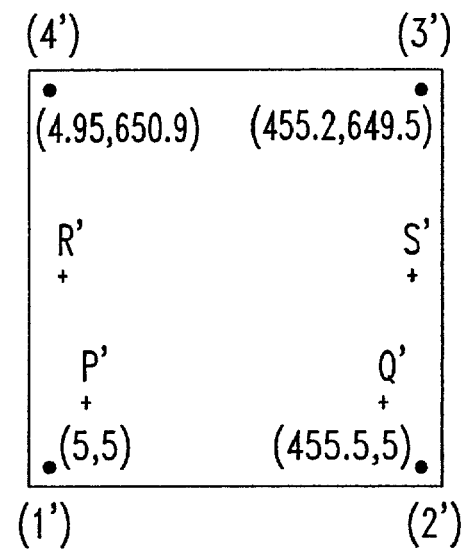
*FIG. 2a*  *FIG. 2b*

MODEL FOR MODIFYING DRILL DATA TO PREDICT HOLE LOCATIONS IN A PANEL STRUCTURE

BACKGROUND OF THE INVENTION

1. Field of the Invention

The present invention relates to a method of creating a mathematical model which is employed in the determination of at least one work location in a multi-layered laminated circuit panel. More particularly, the invention is directed to the creation of a mathematical model for modifying drill data which takes into consideration translational and rotational compensations caused by the encountered stretching or shrinking of the multi-layered panel subsequent to pressing or due to thermally processing, whereby the mathematical model may be utilized to modify drill data in order to accurately predict hole or via locations.

In the implementation of pressing and/or thermal processes employed in producing multi-layered panels for semiconductor packages, such panels frequently will stretch or shrink in non-uniformly translational and rotational aspects, and consequently may be the source of erroneous locations in the formation of holes or vias which are drilled into the panels, thereby rendering the panels unsuitable for installation in electronic packages, and subjecting the processes to economic losses for the manufactures.

At times, such positional errors in the formation of fiducial holes or vias and slots by means of laser drilling are encountered when utilizing the same machine, such as a drilling apparatus, with the same drilling location set up. Currently, the only translational compensation which is incorporated into the drilling data for drill machines employed in forming holes or vias in panels, such as those for electronic packages or printed circuits, fail to provide any integrated vision systems. This renders any corrections for distortions encountered in the multi-layered panels to be difficult to attain so as to be able to compensate precisely for distortional stretching or shrinkage conditions which are encountered during the pressing or thermal processing of the panels prior to effectuating their drilling.

2. Discussion of the Prior Art

Although numerous publications are presently available, which direct themselves to providing for various types of error compensations, such through the utilization of algorithms and various mathematical programs adapted to compensate for misalignments and distortions in multi-layered printed circuit boards or panels in order to optimize hole or via drill positions, none of these have been able to adequately precisely overcome the distortion problems which are encountered, inasmuch as there is no accounting for encountered dimensional stability problems or compensation factor calculations in both translational and rotational position error considerations.

Whitcomb et al. U.S. Pat. No. 6,030,154 uses a search algorithm to find better holes locations; in fact, tries to find new location in the local of the existing one. However, while establishing change increment, it will vary only to scale shrinkage/growth about the panel center on either x- or y-direction (not both) along with other parameters: i.e. x and y translation, and rotation about the panel center. That means, the patent will establish a change increment in a matrix combination of either ($T_x$, $T_y$, $S_x$, rotation) or ($T_x$, $T_y$, $S_y$, rotation).

To the contrary, the present invention employs an exact mathematical model to predict the better locations for the holes. The model includes translation and scaling (on both x- and y-directions) and rotational compensations, however, the term "rotation" in applicant's disclosure means the change of the angle between two parallel lines after completion of the pressing processes.

Since U.S. Pat. No. 6,030,154 uses a numerical search algorithm, the obtained results cannot be used to modify the data file before importing into a drill machine, but must be manually input by the operators to the drill machine's controllers.

In the present disclosure, the resulting compensation factors can be very easily used to modify the data file before importing into the drill machine, for instance, such as to write a simple program that can modify every single point's coordinates using the exact mathematical model.

Forehand et al U.S. Pat. No. 5,710,063 discloses a method to prepare fiducials on a panel, whereby an optically-aligned drill, such as Dynamotion Drill with "Smart Drill" option, is positioned over the panel and adapted to precisely align the bit of the drill with these fiducials. This is not relevant to the present disclosure.

Kosmowski et al. U.S. Pat. No. 5,529,441 differs from the present invention in that different mathematical modes are used to predict hole location; in effect, the patent uses the least squares best fit, while a simple mathematical model is used in my disclosure. In the patent, each panel is being analyzed to determine the compensation factors and drilled with modified data on the same apparatus. Statistical data gathering from a batch of panels is suggested to be used for improving other process registrations, such as lamination registration. To the contrary, in the present invention a batch of panels is being analyzed to determine the compensation factors. Drill data is then modified and fed into drill machines that do not have an integrated vision system to drill the panels.

Amman et al. U.S. Pat. No. 5,206,820 discloses a method adapted to analyze panel misregistration in a printed circuit board. It requires a mean to align the center of the panel with the center of the master pattern etched on a glass reference. Then the detected corner offsets of the panel are measured and transformed into eight primary parameters, which are directional shifts $\Delta x$ and $\Delta y$, rotation with respect to center of the panel $\theta$, directional distortions $\alpha$ and $\beta$, shear $\gamma$, and directional expansions $\epsilon_x$ and $\epsilon_y$. In fact, these eight parameters are the coefficient or a combination of the coefficients of the models:

$$U = a_o + a_1 x + a_2 y + a_3 xy,$$

$$V = b_o + b_1 x + b_2 y + b_3 yx.$$

where U and V are the horizontal and vertical displacements of the detected corners. A set of these eight primary parameters collected from a sampling of panels selected from a manufacturing lot is then used to calculate advanced parameters. Such advanced parameters including the average, the standard deviation, and the range of the primary parameters are claimed as critical means to analyze panel misregistration.

Thus, this patent uses different mathematical models to understand the probable causes of panel misregistration, whereas the method of the present invention to modify data due to the shrinkage/stretch of the panels.

Araki U.S. Pat. No. 5,223,536 pertains to a method of perforating a printed circuit board with a pair of perforating devices. The distance between the two perforating devices is adjusted to be equal to the actual distance of two patterns on the panel, which is detected by an image processing device.

Then the two perforating devices perforate the printed circuit board at the same time. Thus, this patent is completely irrelevant to the present inventive concept.

Alzmann et al. U.S. Pat. No. 4,829,375 is directed to a method and apparatus for automatically punching tooling slots or holes into a panel. The apparatus employs a vision system to locate two fiducial marks on the panel, wherein the vision system defines references for the fiducial targets and preset reference. A positioning system moves the panel to position the fiducial marks on the panel directly in relationship to the preset references. After the positioning operation, tooling slots or holes are punched on the panel. Thus, this patent has nothing in common with the present invention.

Zachman et al. U.S. Pat. No. 5,111,406 discloses a method that engages a fixture on a multi-layered panel. The fixture is carefully prepared with fixture holes that correspond to the locations of the fiducial pads on layers of the panels. The patented apparatus uses x-rays to capture at the same time, coordinates of the measured locations of the fiducial pads on a multi-layered panel and coordinates of the ideal locations of the fixture holes. These coordinates from a sample of panels are then analyzed by a "Best Fit algorithm".

The offsets are fitted to produce a single offset value that may be sent to a drilling machine to determine a position for drilled holes in the panel. Thus, unlike the present invention, this patent mainly discusses the method and apparatus used to determine the fitted offsets that are added to each of the ideal drill coordinates. In addition, it is not known as to how the "Best Fit algorithm" actually works, and in any case ha nothing in common with the present invention.

Hale et al. U.S. Pat. No. 4,123,695 is directed to a method using a vision system to automatically position the drill bit to a desired location; therefore, is completely irreverent to the present invention.

Wilent et al U.S. Pat. No. 4,790,694 discloses a method and apparatus intended to determine locations of three fiducial marks on a multi-layered printed circuit board prior to drilling. The patent employs the best least square fit to minimize any misaligning between four target areas on the board and the precisely located target holes on a template. After optimization, three fiducial marks are punched along one edge of the board. These three fiducial marks are then used to position the board in a drilling apparatus.

Japanese Patent JP 3136708 discloses a method of employing an image pickup device to obtain the coordinates of register marks at several positions in a work piece, then boring process will be adapted to geometrical distortions of the workpiece.

Finally, European Patent EPO 669792 is primarily a European version of U.S. Pat. No. 5,529,441 to Kosmowski et al., and the comments directed thereto are equally applicable to the European patent.

SUMMARY OF THE INVENTION

In essence, none of the prior art patent publications are adapted to provide a method of creating a mathematical model for modifying drill data employed in the drilling of holes or vias in a multi-layered panel or printed circuit board, which takes into account both translational and rotational compensations in x and y directional planes due to the stretching or shrinking of the panels encountered due to pressing or thermal processing of the panels. Although the present invention is directed to the translation and scaling in both x and y directions, the rotational compensations generally are directed to meeting the change in the angle formed between two parallel lines subsequent to the pressing or thermal processing of the panels.

In particular, the inventive concept is essentially contemplated in applying the measurement of some features of a panel, generally, preferable for each panel prior to lamination; implementing lamination of the multi-layered panels; measuring these features subsequent to lamination; utilizing an algorithm to calculate the rotation and scale of coordinate offsets which are encountered in the x and y directions; modifying the data file; and finally drilling the panel based on the modified data file of the information conveyed to a drilling apparatus or machine.

Accordingly, it is an object of the present invention to derive a method for determining at least one work location in a multi-layered laminated circuit panel by providing a first circuitized core element having fiduciary marks, providing at least one additional metallic element, providing a data file having reference coordinates of the multi-layered circuit panel work locations and also having the reference coordinates of the fidicuary mark locations of the first circuitized core element with the reference coordinates of the fiduciary marks of the first circuitized core element, creating a modified work location by adjusting the data file with the rotational and scale coordinate offset of the fiduciary mark locations, and modifying the multi-layered circuit panel at the modified work location.

The foregoing object is obtained by utilizing an algorithm for modifying drill data to locate a multi-layered circuit panel location fiducia utilizing panel rotation, shrinkage expansion and distortion subsequent to lamination of the various panel layers.

Moreover, it is also an object to modify a drill data base so as to produce a drill machine fiducia in a multi-layered circuit panel subsequent to lamination thereof by providing measured rotation and scale offsets to the drill data base.

Another object is to utilize a drill machine with a vision system to measure the after-lamination position of the fiducial marks on the external layer of a multi-layered circuit panel, comparing the position of the fiducial with a drill data base, calculating the offsets and adjusting the drill data base so as to position the holes in compensated locations depending upon the hole coordinates in the multi-layered circuit panel, while utilizing rotational and scalar adjustments transmitted to the drill data base.

BRIEF DESCRIPTION OF THE ACCOMPANYING DRAWINGS

Reference may now be made to the following detailed description of preferred embodiments of the invention, taken in conjunction with the accompanying drawings; in which:

FIG. 1 illustrates a diagrammatic representation of the functions x and y which maps the points in a first panel-representing space to corresponding points in a second panel-representing space, before and subsequent to the pressing and/or thermal processing of the multi-layered panel;

FIG. 2a illustrates the coordinates of the reference points on the panel prior to the pressing of thermal processing of the latter; and FIG. 2b illustrates the actual coordinates of the points referred to in FIG. 2a subsequent to the pressing or thermal processing of the panel.

DETAILED DESCRIPTION OF PREFERRED EMBODIMENTS

Referring to detail to the inventive disclosure, a drill machine (not shown), such as a so called SMART drill machine as widely utilized in the technology, is employed to drill laser fiducial holes, vias and slots in a circuit board or panel 12. An integrated vision system of the drilling machine measures the actual locations of four flower marks, as shown in FIG. 2a of the drawings. Thereupon compensation factors are computed for each panel prior to drilling the laser fidicuary holes and slots, whereby the actual locations of the laser fiduciary slots and holes have been modified accordingly. The aspects which are to be considered is the manner in which those hole locations have been modified.

Inasmuch as a four-point alignment algorithm is employed by the present invention, the following offsets are to be imposed.

- X/Y offset between points in the panel and the reference points in the file Panel rotation offset.
- Scaling (stretch and shrink) along each axis.
- Additional X and Y linear scaling, i.e. accounting for both X as a linear function of Y, and Y as a linear function of X.

Inasmuch as the introduction of the panel rotation offset is the primary reason for the encountered "rotational error", the latter in actuality is not an error but is rather, a natural occurrence due to the four-point alignment algorithm.

Set forth hereinbelow is a model for the above-mentioned offsets.

Referring to FIG. 1 the following is indicated:

Consider two panel spaces: the first panel space 12 contains the reference points in the data file $(x_i, y_i)$, the second panel space 14 contains the actual points in the panel $(x'_i, y'_i)$. A function $f(x, y)$ maps the points in the first panel space 12 relative to corresponding points in the second panel space 14 (as shown in FIG. 1). That means, $$x'_i = f_x(x_i, y_i) \text{ and} \quad (1)$$

$$y'_i = f_y(x_i, y_i). \quad (2)$$

From a mathematical standpoint, there are infinite numbers of functions (f(x,y) that can approximately map the two spaces 12 and 14, as shown in the literature. This invention proposes a simple function that follows the predictions, as set forth herein.

With regard to the foregoing, the following Table 1 summarizes the forms of functions f corresponding to the offsets.

TABLE 1

| Offset | $f_x$ | $f_y$ |
| --- | --- | --- |
| X/Y offset between points | $A_x$ | $A_y$ |
| rotation | $D_x y/x$ | $D_y y/x$ |
| scaling | $B_x X$ | $B_x y$ |
| additional scaling | $C_x y$ | $C_x x$ |

Graphically presented is as follows consider two points in the panel before pressing $M(x_1, y_1)$ and $N(x_2, y_2)$, after pressing the two points move to new locations $M'(x'_1, y'_1)$ and $N'(x'_2, y'_2)$. Note that after pressing, the angle (MOH)=arctan $(y_1/x_1)$ changes to new value arctan $(y'_1/x'_1)$. The line MN translates, scales (stretches or compresses), and rotates an angle $\alpha$ to a new location M'N'. Note that in this example, the line MN is stretched due to the increasing in length.

Thus, $$x'_i = A_x + B_x x_i + C_x y_i + D_x y_i / x_{i \text{ and}} \quad (3)$$

$$y'_i = A_y + B_y y_i + C_y x_i + D_y y_i / x_i. \quad (4)$$

Determination of the Coefficients

It is possible then to easily determine the coefficients as follows. Using the same origin, for i=1, 2, 3 and 4, let $(x_i, y_i)$ and $(x'_i, y'_i)$ be the coordinates of four known points before pressing and after pressing, respectively. Writing equations (3) and (4) for x- and y- directions, wherein:

$A_x + B_x x_1 + C_x y_1 + D_x y_1 / x_1 + x'_1$ $A_x + B_x x_2 + C_x y_2 + D_x y_2 / x_2 + x'_2$ $A_x + B_x x_3 + C_x y_3 + D_x y_3 / x_3 + x'_3$ $A_x + B_x x_4 + C_x y_4 + D_x y_4 / x_4 + x'_4$ and $A_y + B_y y_1 + C_y x_1 + D_y y_1 / x_1 + y'_1$ $A_y + B_y y_2 + C_y x_2 + D_y y_2 / x_2 + y'_2$ $A_y + B_y y_3 + C_y x_3 + D_y y_3 / x_3 + y'_3$ $A_y + B_y y_4 + C_y x_4 + D_y y_4 / x_1 + y'_4.$ Solve the above eight independent equations for eight unknowns $A_x$, $A_y$, $B_x$, $B_y$, $C_x$, $C_y$, $D_x$ and $D_y$. Then substitute them to equations (3) and (4).

The above equations can be written in matrix form as, $$\begin{bmatrix} 1 & x_1 & y_1 & y_1/x_1 \\ 1 & x_2 & y_2 & y_2/x_2 \\ 1 & x_3 & y_3 & y_3/x_3 \\ 1 & x_4 & y_4 & y_4/x_3 \end{bmatrix} \begin{bmatrix} A_x \\ B_x \\ C_x \\ D_x \end{bmatrix} = \begin{bmatrix} x'_1 \\ x'_2 \\ x'_3 \\ x'_4 \end{bmatrix} \leftrightarrow T_x \Gamma_x = \Omega_x \text{ and}$$

$$\begin{bmatrix} 1 & y_1 & x_1 & y_1/x_1 \\ 1 & y_2 & x_2 & y_2/x_2 \\ 1 & y_3 & x_3 & y_3/x_3 \\ 1 & y_4 & x_4 & y_4/x_4 \end{bmatrix} \begin{bmatrix} A_x \\ B_x \\ C_x \\ D_x \end{bmatrix} = \begin{bmatrix} x'_1 \\ x'_2 \\ x'_3 \\ x'_4 \end{bmatrix} \leftrightarrow T_r \Gamma_r = \Omega_r.$$

Thus, $$\Gamma_x = T_x^{-1} \Omega_x \text{ and } \Gamma_y = T_y^{-1} \Omega_y. \quad (5) \& (6)$$

Considering to a particular example of the foregoing, in setting forth a model for modifying drill data, reference may now be made to FIGS. 2a and 2b of the drawings.

EXAMPLE

FIG. 2a shows the coordinates of the reference points (1), (2), (3), and (4) before the panel 12 is pressed. FIG. 2b shows the actual coordinates of these points on panel 14 after pressing. Using equations (5) and (6) to determine the coefficients and substituting them into equations (3) and (4), there is obtained, $$x = -5.1895(10)^{-3} + 1.0011_x - 4.6942(10)^{-4}{}_y - 1.9595(10)^{-3} y/x, \text{ and}$$

$$y = -4.6562(10)^{-3} + 0.99991_y + 1.9599(10)^{-5}{}_x - 8.9194(10)^{-3} y/x.$$

For instance, it is now intended to drill 4 holes at the following locations: P (10, 10), Q(450,10), R(5,332.5), and S(455,322.5). The correct coordinates, in the drill program, should be: P' (9.9992, 9.9955), (Q'(450.4851, 9.9954), R'(4, 7225, 32.7805), and S'(455.3425,322.2203).

Computing the angle between the line P'Q' and R'S'. Equation of the line passing P'Q' is $y = -2.2702 (10)^{-7} x + 9.9955$, and equation of the line passing R'S' is $y = 1.2432 (10)^{-3} x + 322.78$. Take two vectors: $\{1, -2.2702(a0) - 7\}_T$ points along P'Q' and $\{1, -1.2432 (10) - 3\}^T$ points along R'S'. Then the angle between these two is 0.001243 radians.

The foregoing should be implemented utilizing a method with the employment with at least 20 multi-layered circuit panels, but preferably not exceeding 41 panels in order to obtain an accurate determination of corrected drill data. Basically, the coordinates of the reference points, indicate to be 4 points on each panel, should be recorded prior to and subsequent to the pressing or thermal processing of the panels 12, the latter of which upon the processing having been completed become actually the somewhat distorted panels 14.

Thereafter, the coefficients should be computed utilizing the above-referenced equations (5) and (6).

Thereafter equations (3) and (4) should be employed in order to modify the drill data prior to inputting into the drill machine so as to derive the correct locations for the holes, vias or slots which are to be drilled into the panels.

The foregoing, quite clearly provides for an extremely simple method in being able to correct the locations for proposed drill holes which are supplied to a drill machine, to thereby inexpensively optimize the production of the multi-layered circuit panels for the electronic packages.

While the invention has been particularly shown and described with respect to preferred embodiments thereof, it will be understood by those skilled in the art that the foregoing and other changes in form and details may be made therein without departing from the spirit and scope of the invention.

What is claimed is:

1. A method for determining at least one work location in a multi-layered laminated circuit panel, said method comprising:
   providing a first circuitized panel element having fiducial marks;
   providing at least one additional metallic panel element;
   providing a data file having reference coordinates with respect to a Cartesian coordinate system Oxy of said at least one multi-layered circuit panel work location and having reference coordinates of said fiducial marks of said first circitized panel element;
   laminating said first circuitized panel core element with said at least one additional metallic panel element to form said multi-layered circuit panel;
   measuring the locations of said fiducial marks of said first circuitized panel element in said coordinate system Oxy;
   comparing rotational and scalar coordinate offset of said fiducial mark locations of said first circuitized panel element with said reference coordinates of said fiducial marks of said first circuitized panel element;
   creating at least one modified work location by adjusting said data file with said rotational and scalar coordinate offset of said fiducial mark locations; and
   dimensionally modifying said multi-layered circuit panel at said modified work location.

2. A method as claimed in claim 1, comprising creating a mathematical model for determining at least one work location in said multi-layered panel, wherein said mathematical model employs an algorithm considering translational and rotational compensations caused by panel rotation, shrinkage, stretching, expansions and distortions during pressing and thermal processing of said panel, said algorithm facilitating the accurate predication of the location of said at least work location subsequent to the processing of said panel.

3. A method as claimed in claim 2, wherein said algorithm modifies drill data for producing drill machine fiducia in the drilling of a hole, via or slot at said at least one work location.

4. A method as claimed in claim 3, wherein said drill data fiducia is produced in said multi-layered panel after lamination thereof by providing measured rotational, translational and scalar offset data to said drill data to modify said at least one work location in said panel.

5. A method as claimed in claim 2, wherein a plurality of said work locations are measured prior to lamination of the layers of said multi-layered panel; laminating said panel layers; measuring said work locations subsequent to lamination and resultant processing of said laminated panel; utilizing said algorithm to calculate rotational and scalar coordinate offsets resulting from said panel processing; modifying a data file of said measured values; and drilling said panel wit the modified data file at optimized work locations.

6. A method as claimed in claim 5, wherein a plurality of said multi-layered panels are sampled for said offsets by employing the algorithm considering said translational and rotational compensating so as to derive an optimized mathematical model of corrective drill data.

7. A computer program device readable by a machine, tangibly embodying a program of instructions executable by a machine to perform method steps for optimizing the drilling of holes, vias and slots in a multi-layered circuit board panel, said method comprising creating a mathematical model for determining at least one work location in said multi-layered panel, wherein said mathematical model employs an algorithm considering translational and rotational compensations caused by panel rotation, shrinkage, stretching, expansions and distortions during pressing and thermal processing of said panel, said algorithm facilitating the accurate predication of the location of said at least work location subsequent to the processing of said panel, and wherein said algorithm modifies drill data for producing drill machine fiducia in the drilling of a hole, via or slot at said at least one work location.

8. A computer program as claimed in claim 7, wherein said drill data fiducia is produced in said multi-layered panel after lamination thereof by providing measured rotational, translational and scalar offset data to said drill data to modify said at least one work location in said panel.

9. A computer program as claimed claim 7, wherein a plurality of said work locations are measured prior to lamination of the layers of said multi-layered panel; laminating said panel layers; measuring said work locations subsequent to lamination and resultant processing of said laminated panel; utilizing said algorithm to calculate rotational and scalar coordinate offsets resulting from said panel processing; modifying a data file of said measured values; and drilling said panel with the modified data file at optimized work locations.

10. A computer program device for determining said at least one work location in said multi-layered laminated circuit panel as claimed in claim 7, said method comprising:
providing a first circuitized panel element having fiducial marks;
providing at least one additional metallic panel element;
providing a data file having reference coordinates of said at least one multi-layered circuit panel work location and having reference coordinates of said fiducial marks of said first circitized panel element;
laminating said first circuitized panel core element with said at least one additional metallic panel element to form said multi-layered circuit panel;
measuring the locations of said fiducial marks of said first circuitized panel element;
comparing rotational and scalar coordinate offset of said fiducial mark locations of said first circuitized panel element with said reference coordinates of said fiducial marks of said first circuitized panel element;
creating at least one modified work location by adjusting said data file with said rotational and scalar coordinate offset of said fiducial mark locations; and
dimensionally modifying said multi-layered circuit panel at said modified work location.

11. A computer program device as claimed in claim 10, comprising creating a mathematical model for determining at least one work location in said multi-layered panel, wherein said mathematical model employs an algorithm considering translational and rotational compensations caused by panel rotation, shrinkage, stretching, expansions and distortions during pressing and thermal processing of said panel, said algorithm facilitating the accurate predication of the location of said at least work location subsequent to the processing of said panel.

12. A computer program device as claimed in claim 11, wherein said algorithm modifies drill data for producing drill machine fiducia in the drilling of a hole, via or slot at said at least one work location.

13. A computer program device as claimed in claim 12, wherein said drill data fiducia is produced in said multi-layered panel after lamination thereof by providing measured rotational, translational and scalar offset data to said drill data to modify said at least one work location in said panel.

14. A computer program device claimed in claim 11, wherein a plurality of said work locations are measured prior to lamination of the layers of said multi-layered panel; laminating said panel layers; measuring said work locations subsequent to lamination and resultant processing of said laminated panel; utilizing said algorithm to calculate rotational and scalar coordinate offsets resulting from said panel processing; modifying a data file of said measured values; and drilling said panel with the modified data file at optimized work locations.

15. A computer program device as claimed in claim 14, wherein a plurality of said multi-layered panels are sampled for said offsets by employing the algorithm considering said translational and rotational compensating so as to derive an optimized mathematical model of corrective drill data.

* * * * *